United States Patent [19]

Ogawa

[11] Patent Number: 5,477,966
[45] Date of Patent: Dec. 26, 1995

[54] PACKING BOX FOR LEAD TERMINAL TYPE SEMICONDUCTOR PRODUCT

[75] Inventor: Shogo Ogawa, Kawasaki, Japan

[73] Assignee: Fuji Electric Co., Ltd., Kawasaki, Japan

[21] Appl. No.: 263,352

[22] Filed: Jun. 21, 1994

[30] Foreign Application Priority Data

Jun. 28, 1993 [JP] Japan .................................. 5-155937

[51] Int. Cl.⁶ .................................................. B65D 73/02
[52] U.S. Cl. ........................... 206/723; 206/722; 206/591; 206/594
[58] Field of Search ....................................... 206/328, 329, 206/331, 334, 523, 722, 723, 726, 591, 594

[56] References Cited

U.S. PATENT DOCUMENTS

| | | | |
|---|---|---|---|
| 2,214,230 | 9/1940 | Freeburg | 206/331 |
| 2,518,450 | 8/1950 | Cowen et al. | 206/331 |
| 3,092,245 | 6/1963 | Poisson | 206/331 |
| 3,421,679 | 1/1969 | Goldman | 206/523 |
| 3,631,297 | 12/1971 | Conner | 206/328 |
| 3,847,274 | 11/1974 | Inglish et al. | 206/523 |
| 4,129,213 | 12/1978 | Fleig | 206/523 |
| 4,241,829 | 12/1980 | Hardy | 206/328 |
| 4,333,565 | 6/1982 | Woods | 206/329 |
| 4,496,627 | 1/1985 | Azuma | |
| 4,573,574 | 3/1986 | Connery | 206/331 |
| 4,790,433 | 12/1988 | Raszewsi | 206/329 |
| 4,977,483 | 12/1990 | Perretta | 206/328 |

FOREIGN PATENT DOCUMENTS 0152680  6/1990  Japan .................................. 206/331

*Primary Examiner*—Paul T. Sewell
*Assistant Examiner*—Marie Denise Patterson
*Attorney, Agent, or Firm*—Kanesaka & Takeuchi

[57] ABSTRACT

A packing device for semiconductor devices with lead terminals includes a packing box, partitions for separating a space in the packing box, and a cover. A conductive sponge used as a cushioned packing material is attached to the back surface of the cover. The semiconductor devices are placed in the packing box 3 with the lead terminals 2 facing upwardly. In this packed state, the conductive sponge is pressed against the lead terminals to collectively hold the semiconductor devices securely in the box. Thus, short-circuitting of the lead terminals is made to prevent gate of the semiconductor devices from breaking down as a result of electrostatic voltage.

3 Claims, 3 Drawing Sheets

5,477,966

PACKING BOX FOR LEAD TERMINAL TYPE SEMICONDUCTOR PRODUCT

BACKGROUND OF THE INVENTION AND RELATED ART STATEMENT

The present invention relates to a packing box used for lead terminal type semiconductor devices, including insulated gate type semiconductor devices such as MOSFETs and IGBTs.

The gates of insulated gate semiconductor devices or products such as a MOSFETs or IGBTs may break down if electrostatic voltage is applied accidentally between the terminals. Therefore, electrostatic voltage must be prevented when such semiconductor products are shipped or stored.

The semiconductor products, structure of conventional packing boxes, and conventional packing procedure as stated above are explained with reference to FIGS. 4 and 5. FIG. 4 shows a shape or configuration of a single in-line type lead terminal semiconductor device, wherein reference numeral 1 represents a resin package incorporating therein the insulated gate semiconductor elements such as MOSFETs and IGBTs alone or together with other electronic elements, and reference numeral 2 represents lead terminals projecting from the package 1 and arranged linearly.

In order to pack such semiconductor products before shipment, a corrugated fiberboard packing box 3 as shown in FIG. 5 has been prepared. The packing box 3 comprises a box body 3a, inner partitions 3b, and an upper cover 3c. When semiconductor products 4 are packed in the packing box 3, the products 4 are put in conductive bags 5, which shield the products electrostatically. The products are then placed in the box 3 so that the lead terminals 2, which are not mechanically strong, orient upwardly. The cover 3c is then placed on the box body 3a. Instead of the conductive bag 5, a piece of metal may be attached to the lead terminals 2 of each semiconductor product for short-circuitting to thereby prevent the product from breakdown due to electrostatic voltage.

The above conventional packing method is, however, not very efficient because each semiconductor product 4 must be put in a conductive bag, or some other method must be applied to prevent the product from breakdown due to electrostatic voltage before the products are packed in the packing box 3. This method is also troublesome when the packing box 3 is opened at the destination to take out the semiconductor products 4, because each product 4 must be picked up from a portion situated between the inner partitions 3b of the box body 3a, and the bag 5 must then be removed. Furthermore, the semiconductor products may shake and collide with the cover or side wall of the box 3 as a result of shocks or vibrations that may occur during transportation, to thereby cause the lead terminals 2 to be damaged.

In view of the above problems, the present invention has been made, and it is objects of the invention to provide a packing box for solving the problems that often occur with the lead terminal type semiconductor products, and for allowing the products in the box to be securely held in place, for enabling simple packing and taking out the products as well as for preventing the product from breakdown due to electrostatic voltage.

SUMMARY OF THE INVENTION

In order to achieve the above objects, in the packing method, a plurality of products is arranged and retained in a packing box, and a conductive cushioning material is positioned against the lead terminals of the semiconductor products to collectively hold the products securely in the box.

The cushioning material used in the packing method is preferably a conductive sponge, into which the lead terminals of the semiconductor products can easily be inserted or stuck.

On the other hand, the packing box of the invention, which is used to implement the above packing method for single in-line lead terminal semiconductor devices, includes a conductive sponge as a cushioning material for collectively holding the products securely in the box with the lead terminals directing upwardly. The conductive sponge is pressed against the lead terminals of the respective semiconductor products to hold the products in place.

The packing box is preferably formed in such a way that the conductive sponge is attached to the back surface of the packing box cover. In this case, the sponge should be of a thickness to allow the lead terminals of the semiconductor device to enter into the sponge attached to the box cover in the condition that the cover is placed on the box.

With the packing box of the above structure, even if the semiconductor products are packed without a bag or any other covering device, the products are stably held by the cushioning material. Consequently, the semiconductor products do not shake despite the vibrations that may occur during transportation, to thereby protect the fragile lead terminals. In addition, since the lead terminals of the semiconductor products are sticked into the conductive sponge to cause short-circuitting of the lead terminals, the semiconductor products are completely protected from the gate breakdown due to electrostatic voltage, even if each semiconductor product is not put in a conductive bag or other such device to prevent electrostatic voltage.

Furthermore, when the semiconductor products are taken out from the packing box, the box is turned upside down and the box body is raised to thereby unpack the products from the box body. The products are picked up from the box body in the condition that the lead terminals are still stuck in the conductive sponge on the cover. As a result, the products can be simply taken out individually from the conductive sponge by hand without touching the lead terminals.

DETAILED DESCRIPTION OF A PREFERRED EMBODIMENT

Figure 1:
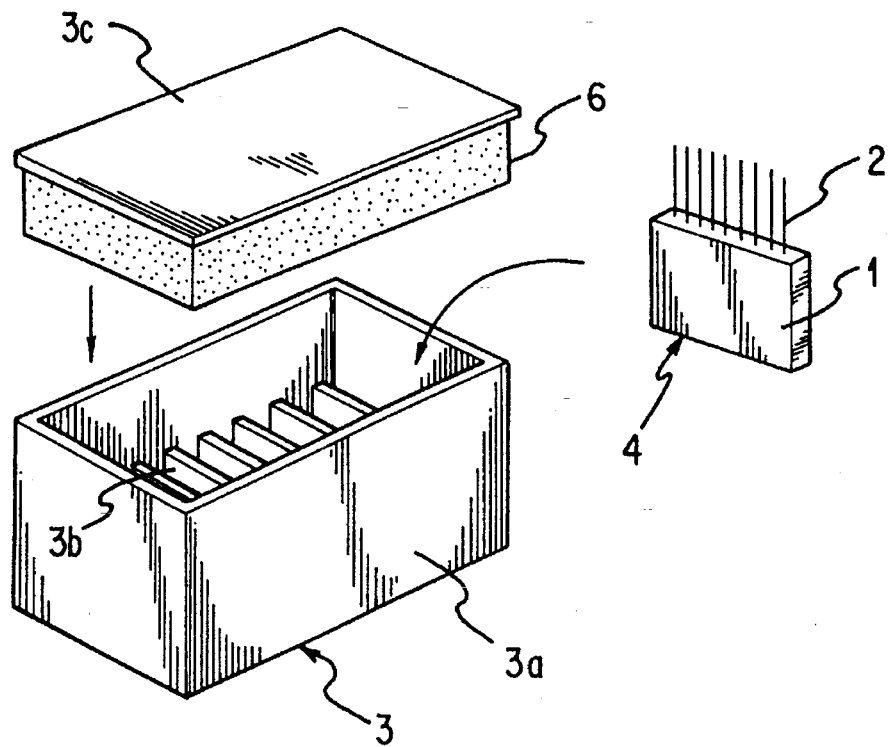
FIG. 1 is an explanatory perspective view illustrating a procedure for packing semiconductor products together with a packing box in accordance with the invention.
Figure 2:
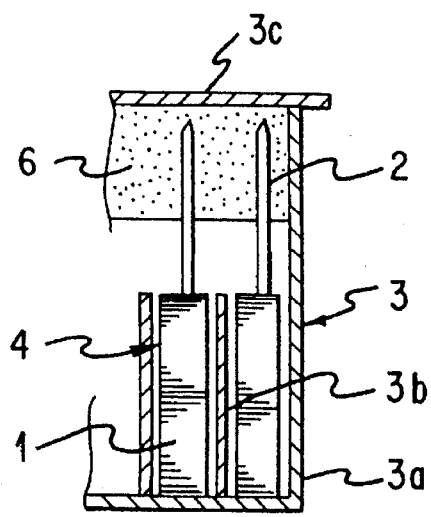
FIG. 2 is a partial section view of the packing box of FIG. 1 with the semiconductor products in the packed state.
Figure 3:
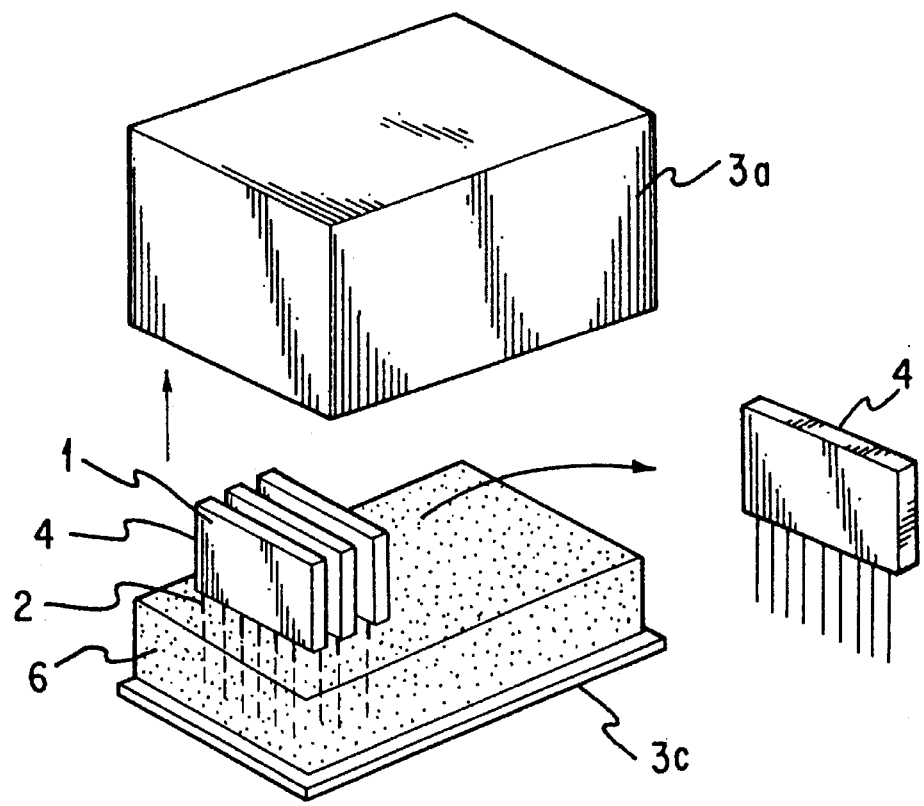
FIG. 3 is an explanatory perspective view illustrating a procedure for unpacking the products from the packing box shown in FIG. 1 and taking out the semiconductor products.
Figure 4:
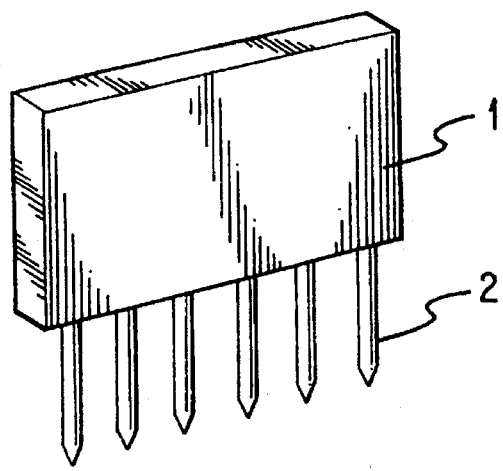
FIG. 4 is a perspective view of a lead terminal type semiconductor device for which the invention is used.
Figure 5:
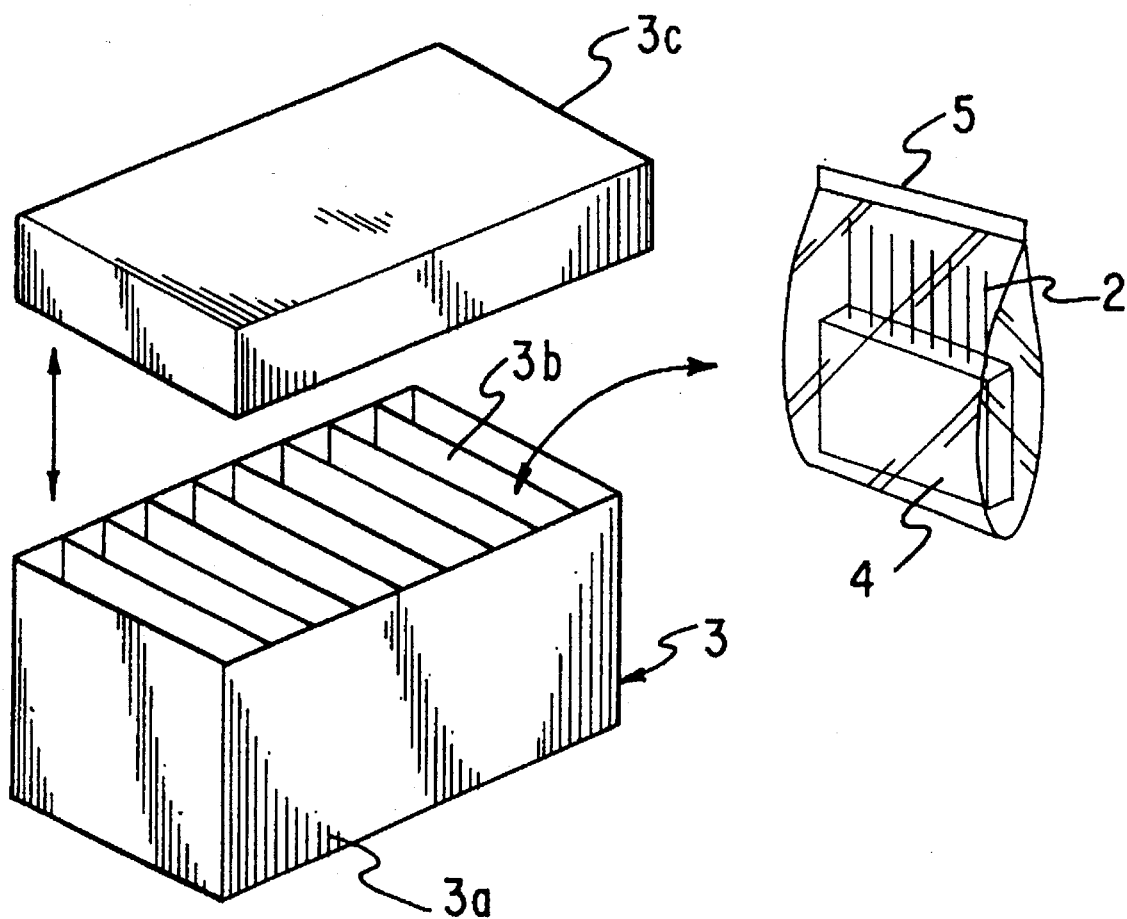
FIG. 5 is an explanatory perspective view illustrating a packing box as well as a conventional procedure for packing the semiconductor products.

An embodiment of the invention is described based on FIGS. 1 to 3. In FIG. 1, a packing box 3 is formed of a box body 3a, inner partitions 3b, a cover 3c and a conductive sponge 6 attached to the back surface of the cover 3c to serve as a cushioning material. The cushioning material is a soft foam formed by mixing conductive powder and a foaming agent in a resin material. The lead terminals of the semiconductor product to be retained in the box can be easily stuck or entered into the cushioning material.

The semiconductor products may be a single in-line lead terminal type semiconductor product 4, such as an insulated gate type semiconductor element. The semiconductor products are situated in the spaces between the inner partitions 3b with the lead terminals 2 directing upwardly. The cover 3c is then placed on the box body. The box in the packed state is shown in FIG. 2.

The inner partition 3b inside the box body 3a is of nearly the same height as the length of a package 1 of the semiconductor product 4. On the other hand, the conductive sponge 6 has nearly the same lateral area as the opening of the box body 3a and is attached to the back surface of the cover 3c. The conductive sponge 6 is of a thickness for allowing at least the tip of the lead terminals protruding from the package 1 to enter or stick into the sponge 6 in the packed state, as shown in FIG. 2.

In this structure, when the semiconductor products 4 are arranged in the box body 3 and the cover 3c is placed on the box body, the conductive sponge 6 serves as a cushioning material to collectively hold the products 4 in the box body, as shown in FIG. 2. Therefore, the semiconductor products 4 are stably held in place in the box without being shaken, even if vibrations occur during transportation. In this way, the lead terminals 2, which are not mechanically strong, are prevented from accidental damages. The lead terminals of the semiconductor product 4 are stuck into the conductive sponge 6 to cause short-circuitting of the terminals, so that the products are protected from gate breakdown due to electrostatic voltage.

On the other hand, when the semiconductor products 4 are removed from the packing box 3, the box 3 is turned upside down so that the cover 3c faces downward as shown in FIG. 3, and then the box body 3a is removed. In this state, the packages 1 of the semiconductor products 4 face upwardly, and the lead terminals 2 are held in place by the conductive sponge 6. A worker can, therefore, individually take out the products 4 by picking up the package 1 without touching the lead terminal 2.

In this respect, if the ambient air is dry, electrostatic voltage generated in the operator's body may be discharged into the lead terminal when it is touched to break down the semiconductor gate device. In the invention, since the operator need not touch the lead terminal, the semiconductor device is not damaged by the electrostatic voltage.

As described above, in the invention, the semiconductor products can be easily inserted into and removed from the packing box, and it is unnecessary to take troublesome action, such as covering the semiconductor product, to prevent the product from breakdown due to electrostatic voltage. In the packed condition of the semiconductor products until removal from the box, it is possible to protect the gates or lead terminals from breaking as a result of electrostatic voltage or vibrations that may occur during transportation.

What is claimed is:

1. A packing device for semiconductor devices with lead terminals, comprising, a packing box for holding a plurality of semiconductor devices therein, said packing box including a bottom portion with four edges, four side portions extending upwardly from the edges of the bottom portion to form an elongated space therein, and a plurality of partitions extending from the bottom portion between opposing two side portions for substantially equally dividing the elongated space in the packing box for the respective semiconductor devices, said partition having a height less than heights of the side portions to form an upper common area in the packing box not separated by the partitions, a cover extending over the side portions of the packing box to close the packing box, and a cushioning material attached to a back surface of the cover, said cushioning material being formed of a conductive sponge and having a lateral size to be completely located in the upper common area surrounded by the four side portions and a thickness less than a height of the upper common area, each semiconductor device being held in the space separated by the partition and the lead terminals engaging the sponge to collectively hold the semiconductor devices and to protect the semiconductor devices from electrostatic voltage.

2. A combination of semiconductor devices and a packing device thereof, comprising, a plurality of semiconductor devices, each having a package and a plurality of lead terminals extending from one side of the package, a packing box for holding a plurality of said semiconductor devices therein, said packing box including a bottom portion with four edges, four side portions extending upwardly from the edges of the bottom portion to form an elongated space therein, and a plurality of partitions extending from the bottom portion between opposing two side portions for substantially equally dividing the elongated space in the packing box for the respective semiconductor devices, said partition having a height less than heights of the side portions to form an upper common area in the packing box not separated by the partitions, a cover extending over the side portions of the packing box to close the packing box, and a cushioning material attached to a back surface of the cover, said cushioning material being formed of a conductive sponge and having a lateral size to be completely located in the upper common area surrounded by the four side portions and a thickness less than a height of the upper common area, each package of the semiconductor device being held in the space separated by the partitions and the lead terminals extending upwardly from the package to the upper common area so that when the cover with the cushioning material is placed over the packing box with the semiconductor devices, the lead terminals engage the conductive sponge to collectively hold the semiconductor devices and to protect the semiconductor devices from electrostatic voltage.

3. A combination of claim 2, wherein the semiconductor device is a single in-line lead terminal type semiconductor.

* * * * *